United States Patent
Edelstein et al.

(10) Patent No.: US 7,375,021 B2
(45) Date of Patent: May 20, 2008

(54) METHOD AND STRUCTURE FOR ELIMINATING ALUMINUM TERMINAL PAD MATERIAL IN SEMICONDUCTOR DEVICES

(75) Inventors: Daniel C. Edelstein, White Plains, NY (US); Mukta G. Farooq, Wappingers Falls, NY (US); Robert Hannon, Wappingers Falls, NY (US); Ian D. Melville, Highland, NY (US)

(73) Assignee: International Business Machines Corporation, Armonk, NY (US)

( * ) Notice: Subject to any disclaimer, the term of this patent is extended or adjusted under 35 U.S.C. 154(b) by 130 days.

(21) Appl. No.: 11/308,539

(22) Filed: Apr. 4, 2006

(65) Prior Publication Data
US 2007/0232049 A1    Oct. 4, 2007

(51) Int. Cl.
*H01L 21/44* (2006.01)
(52) U.S. Cl. .................. 438/613; 257/738; 257/780; 257/E21.508
(58) Field of Classification Search ............... 257/738, 257/780, E21.508; 438/611–613
See application file for complete search history.

(56) References Cited

U.S. PATENT DOCUMENTS

| 5,583,285 | A  | * | 12/1996 | Hahn et al. ............. 73/64.52 |
| 6,187,680 | B1 |   | 2/2001  | Costrini et al. |
| 6,489,229 | B1 | * | 12/2002 | Sheridan et al. ............ 438/614 |
| 6,583,039 | B2 | * | 6/2003  | Chen et al. ................. 438/612 |
| 6,767,819 | B2 | * | 7/2004  | Lutz ........................... 438/614 |
| 6,905,909 | B2 | * | 6/2005  | Cui et al. .................... 438/105 |
| 2002/0142592 | A1 |   | 10/2002 | Barth et al. |
| 2003/0136814 | A1 |   | 7/2003  | Furman et al. |
| 2003/0137058 | A1 |   | 7/2003  | Magerlein et al. |
| 2003/0217462 | A1 |   | 11/2003 | Wang et al. |
| 2004/0084782 | A1 |   | 5/2004  | Magerlein et al. |
| 2004/0099632 | A1 |   | 5/2004  | Daubenspeck et al. |

OTHER PUBLICATIONS

D. Edlstein et al., "Full Copper Wiring in a Sub-0.25 μm CMOS ULSI Technology", VMIC, 12, 301, 1995.

* cited by examiner

*Primary Examiner*—Asok K Sarkar
(74) *Attorney, Agent, or Firm*—Cantor Colburn LLP; Joseph Petrokaitis

(57) ABSTRACT

A method for far back end of line (FBEOL) semiconductor device formation includes forming a terminal copper pad in an upper level of a semiconductor wafer, forming an insulating stack over the terminal copper pad, and patterning and opening a terminal via within a portion of the insulating stack so as to leave a bottom cap layer of the insulating stack protecting the terminal copper pad. An organic passivation layer is formed and patterned over the top of the insulating stack, and the bottom cap layer over the terminal copper pad is removed. A ball limiting metallurgy (BLM) stack is deposited over the organic passivation layer and terminal copper pad, and a solder ball connection is formed on a patterned portion of the BLM stack.

8 Claims, 6 Drawing Sheets

METHOD AND STRUCTURE FOR ELIMINATING ALUMINUM TERMINAL PAD MATERIAL IN SEMICONDUCTOR DEVICES

BACKGROUND

The present invention relates generally to semiconductor device processing techniques, and, more particularly, to a method and structure for eliminating aluminum terminal pad material in far back end of line (FBEOL) semiconductor structures.

In semiconductor manufacturing, a fabricated integrated circuit (IC) device is typically assembled into a package to be utilized on a printed circuit board as part of a larger circuit. In order for the leads of the package to make electrical contact with the bonding pads of the fabricated IC device, a metal bond is formed to make a connection between the bonding pad of the IC device and a lead extending to the package lead frame. In other configurations, such as a controlled collapse chip connection (C4), a solder ball connection is made to a ceramic or polymeric chip carrier.

In the past, aluminum and aluminum alloys have been used as conventional chip wiring materials. More recently, aluminum wiring material has been replaced by copper and copper alloys, since copper wiring provides improved chip performance and superior reliability when compared to aluminum and alloys of aluminum. However, the packaging of IC devices employing copper wiring presents a number of technical issues related to the reaction of copper with material used in the solder-ball process and/or susceptibility of copper to environmental attack and corrosion.

In current C4 practice, terminal via openings are formed in a passivation layer to the underlying terminal pad copper wiring level. A terminal metal (TD) aluminum pad structure is then conventionally formed over the terminal pad copper, followed by a final organic passivation layer deposition, patterning and curing process before ball limiting (BLM) metallurgy C4 lead-tin solder balls are used to connect to the TD pad. The TD metal process represents increased manufacturing steps and costs associated with the semiconductor structure. It is thus desirable to eliminate the aluminum TD pad, given the present conversion of all chip wiring from aluminum to copper. However, simply eliminating the manufacturing steps of the TD aluminum structure itself from the process of record would expose the copper to the organic passivation materials and to atmospheric conditions, leading to adverse reactions.

SUMMARY

The foregoing discussed drawbacks and deficiencies of the prior art are overcome or alleviated by a method for far back end of line (FBEOL) semiconductor device formation. In an exemplary embodiment, the method includes forming a terminal copper pad in an upper level of a semiconductor wafer, forming an insulating stack over the terminal copper pad, and patterning and opening a terminal via within a portion of the insulating stack so as to leave a bottom cap layer of the insulating stack protecting the terminal copper pad. An organic passivation layer is formed and patterned over the top of the insulating stack, and the bottom cap layer over the terminal copper pad is removed. A ball limiting metallurgy (BLM) stack is deposited over the organic passivation layer and terminal copper pad, and a solder ball connection is formed on a patterned portion of the BLM stack.

In another embodiment, a semiconductor device includes a terminal copper pad formed in an upper level of a semiconductor wafer, an insulating stack formed over the terminal copper pad, a ball limiting metallurgy (BLM) stack formed directly upon the terminal copper pad and upon sidewalls of a patterned passivation layer, and a solder ball connection formed on a patterned portion of the BLM stack.

BRIEF DESCRIPTION OF THE DRAWINGS

Referring to the exemplary drawings wherein like elements are numbered alike in the several Figures.

DETAILED DESCRIPTION

Disclosed herein is a method and structure for eliminating aluminum terminal material at the far back end of line (FBEOL) of semiconductor structures. Briefly stated, an SiC(N, H) cap layer (or nitride or other suitable layer), formed as part of an insulating stack in which terminal copper is formed, is left in place during passivation layer formation, patterning and curing, but then subsequently removed prior to BLM deposition.

Figure 1:
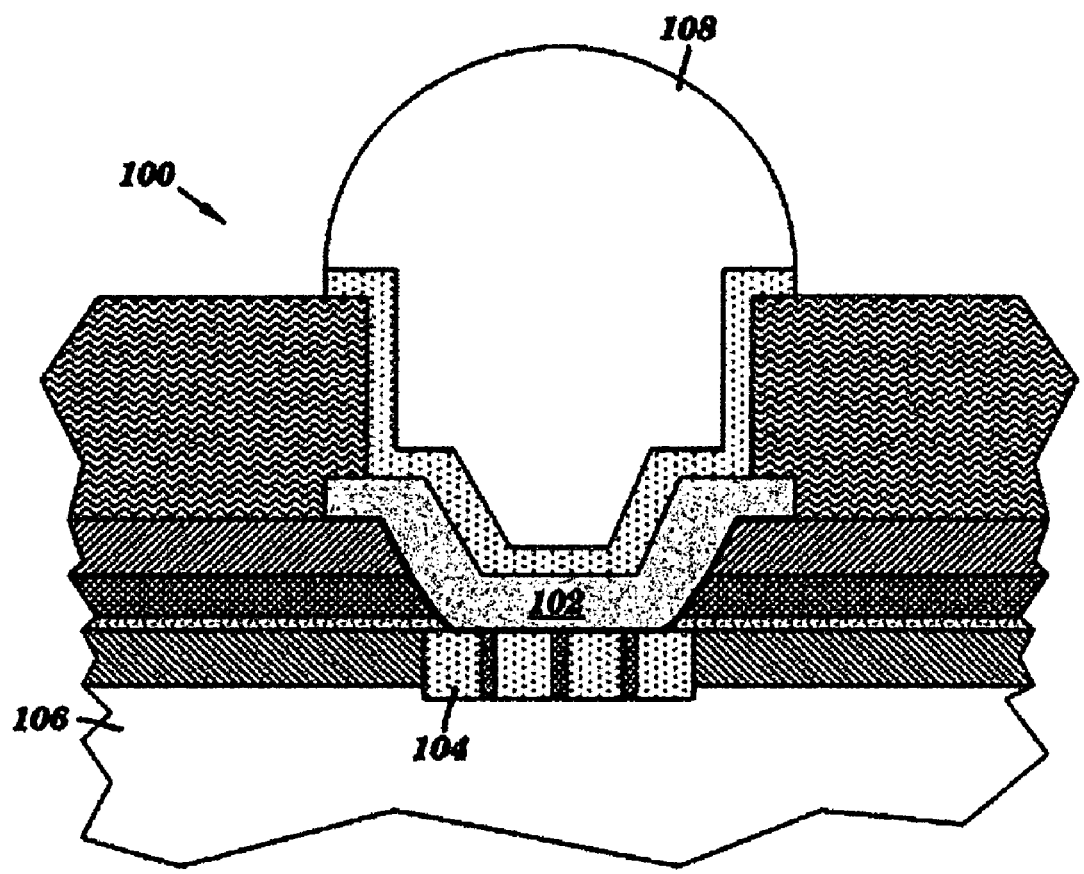
FIG. 1 is a cross-sectional view of a conventionally formed, controlled collapse chip connection (C4) semiconductor device having terminal pad aluminum.

Referring initially to FIG. 1, there is shown a cross-sectional view of a semiconductor device 100 having a terminal metal (TD) aluminum pad structure 102 formed in accordance with conventional FBEOL processing techniques. The device 100 also includes a terminal copper layer 104 formed at the top levels of a semiconductor wafer 106. As is known in the art, this top level terminal copper layer 104 forms an interface between the lower device regions in the wafer 106 (not specifically shown for purposes of simplicity) and the aluminum pad structure 102. The aluminum pad structure 102, in turn, supports a solder ball connection 108 of a C4 configuration, for example, used for bonding the chip to an external device such as a ceramic chip carrier, for instance.

FIGS. 2(a) through 2(e) illustrate an existing process of record for forming the semiconductor device 100 shown in FIG. 1.

The copper layer 104 is formed by deposition within a patterned opening formed in an insulating layer 110, such as fluorinated TEOS (tetraethoxysilane) or a fluorinated silicate glass (FSG) for example. A plurality of vertical oxide pillars 112 may optionally be included within the terminal copper region in order to prevent deep dishing of the copper during polishing (CMP) thereof. Following the CMP of the copper layer 104, an insulating stack 114 is formed over the device 100, through which a TD via 116 is opened (FIG. 2(b)). The stack 114 includes an SiC(N, H) (nitrogen doped hydrogenated silicon carbide) cap layer 118, an oxide layer 120 (e.g., formed by silane deposition), and a silicon nitride layer 122 (e.g., formed by plasma assisted chemical vapor deposition (PECVD)).

Figure 2A:
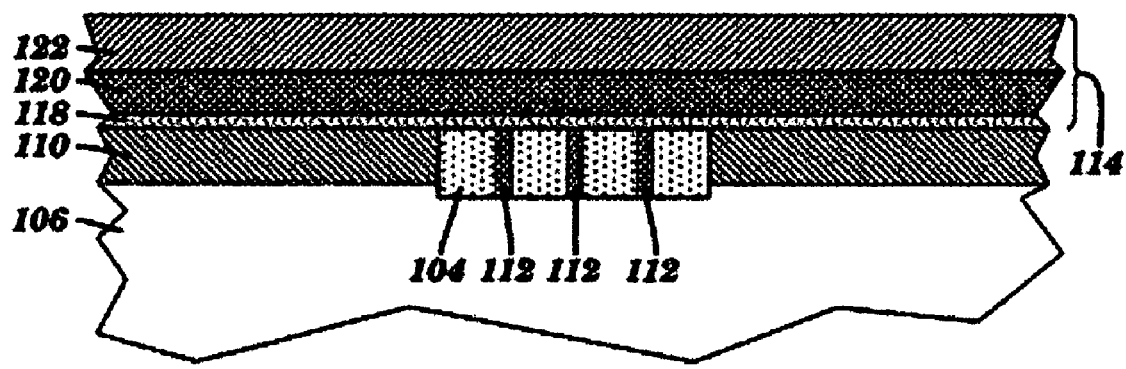
FIGS. 2(a) through 2(e) illustrate a process flow sequence for forming the structure shown in FIG. 1.
Figure 2B:
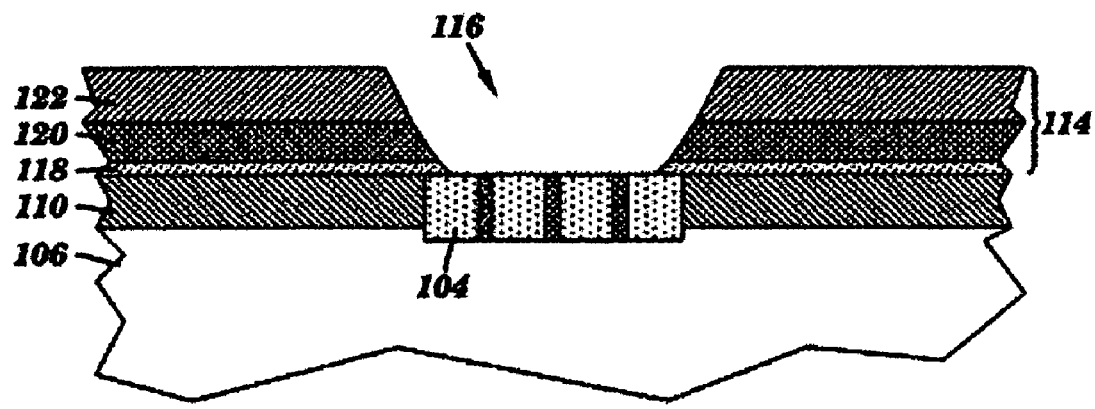
Figure 2C:
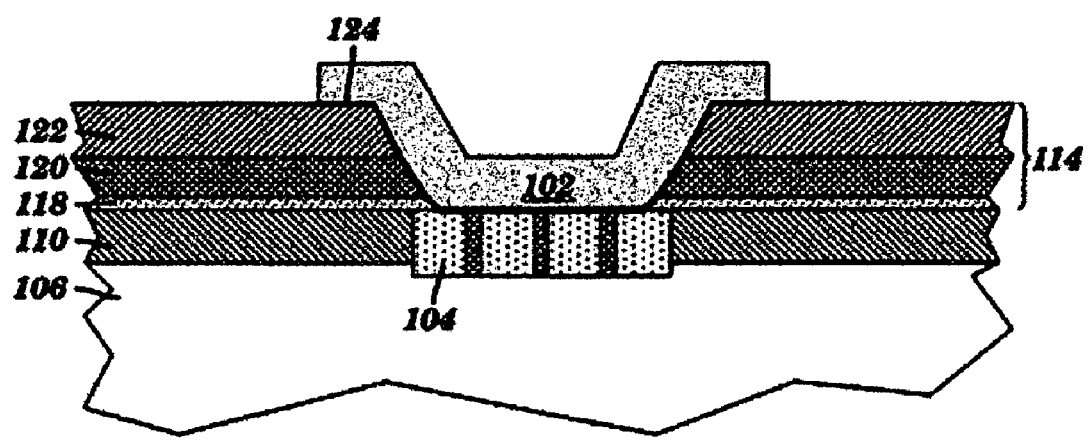
Figure 2D:
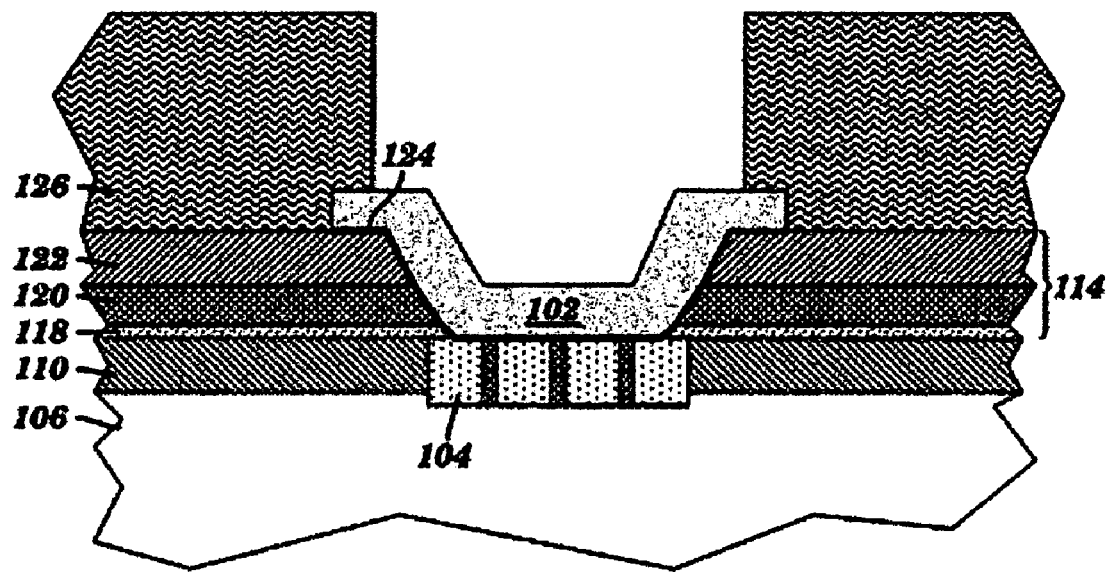
Figure 2E:
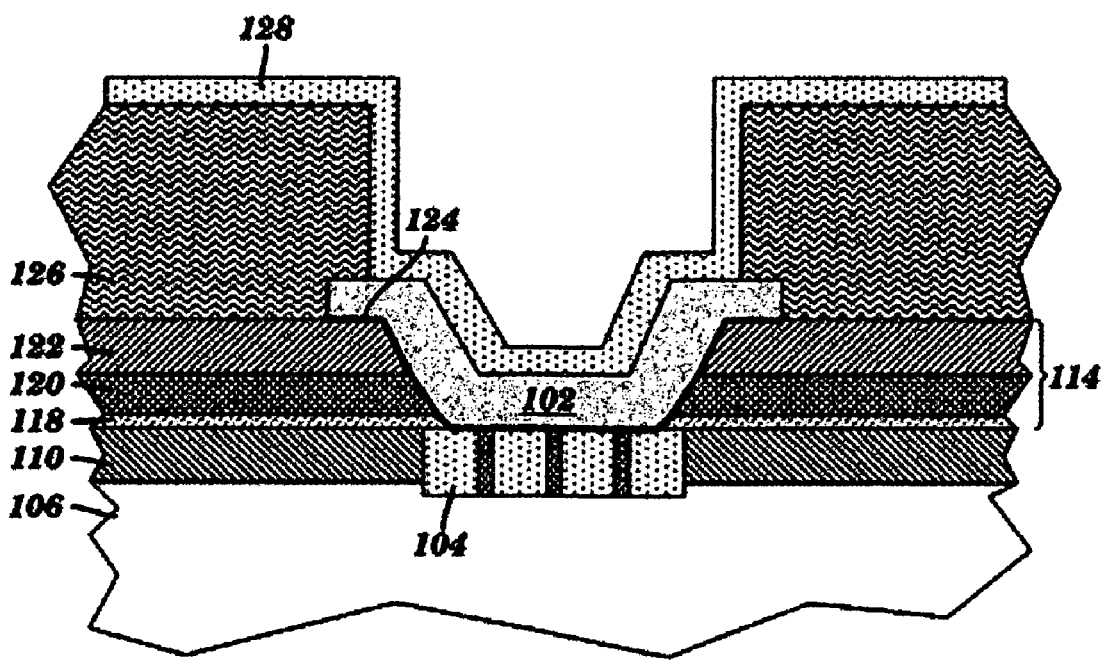
Figure 3A:
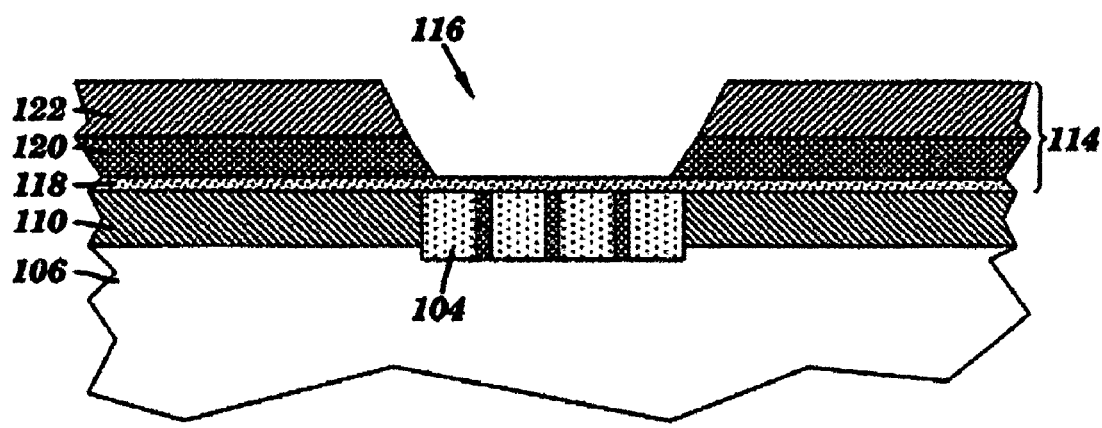
FIGS. 3(a) through 3(e) is a process flow sequence for eliminating aluminum terminal material at the far back end of line of semiconductor structures, in accordance with an embodiment of the invention.
Figure 3B:
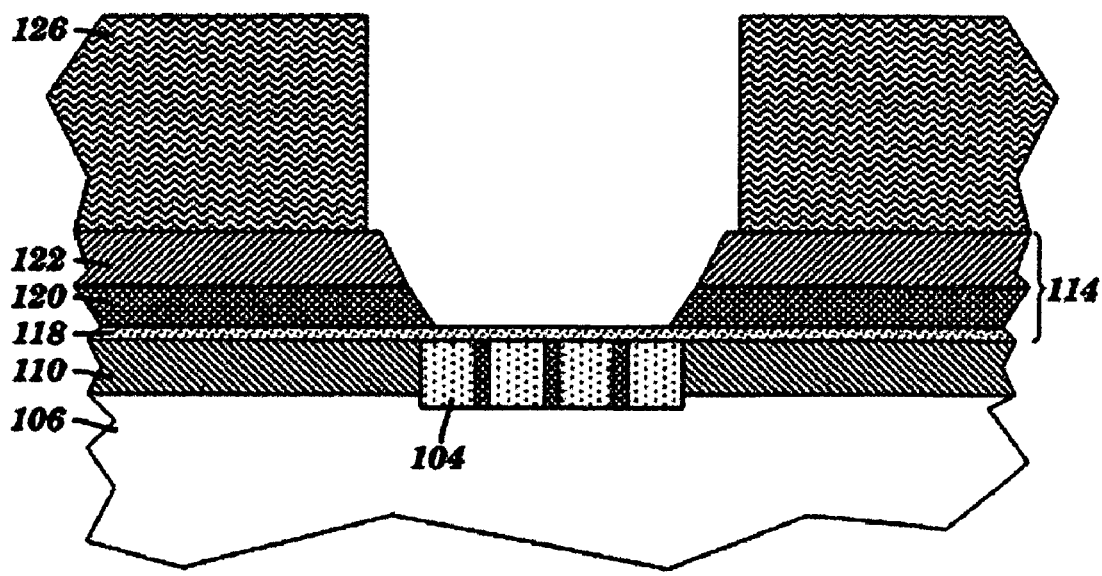
Figure 3C:
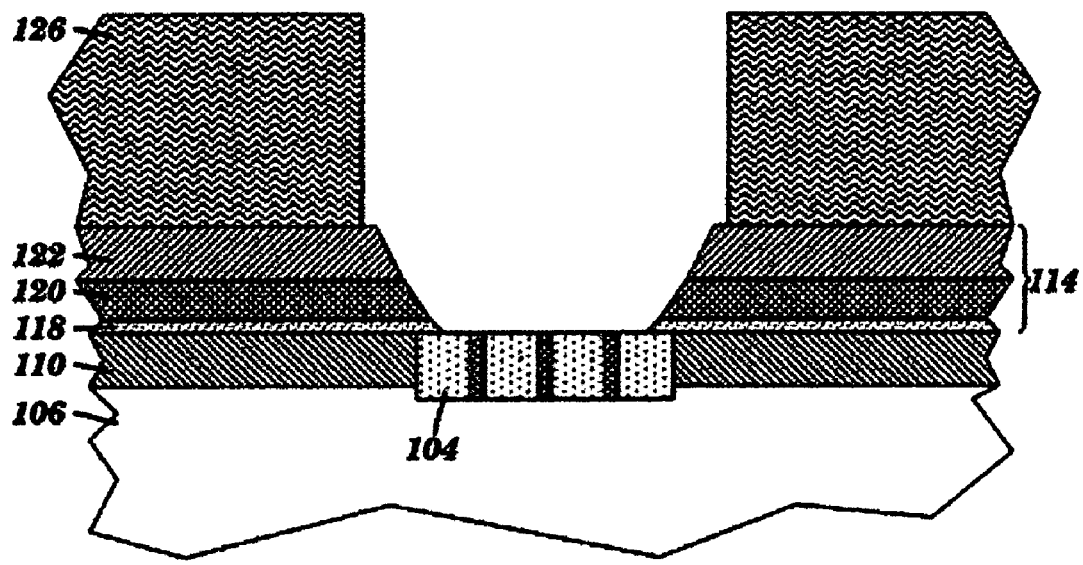
Figure 3D:
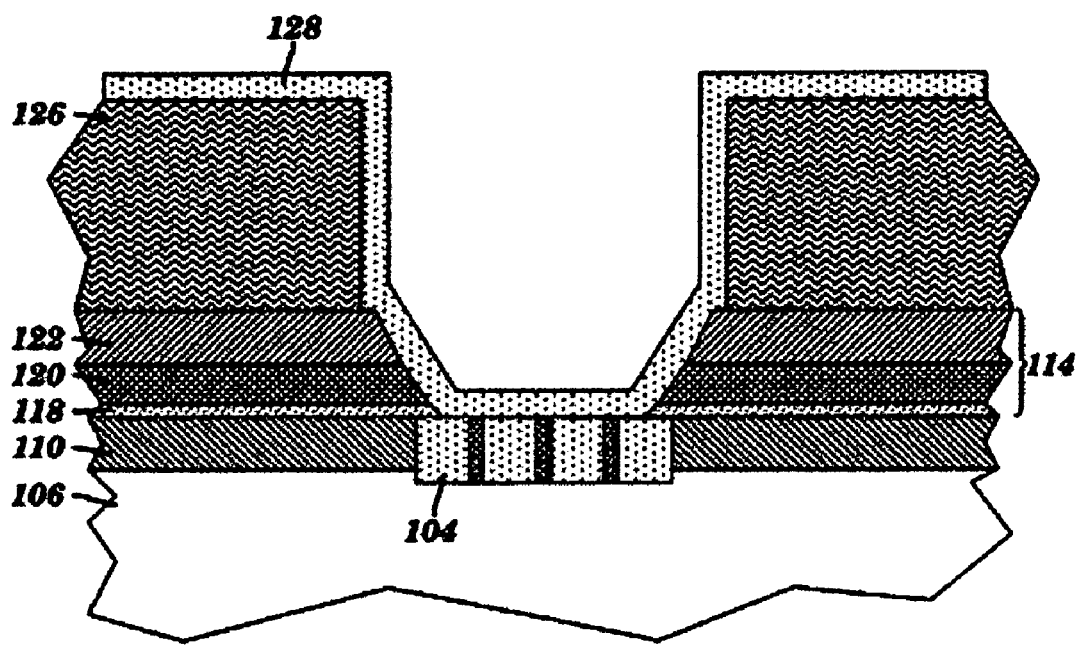
Figure 3E:
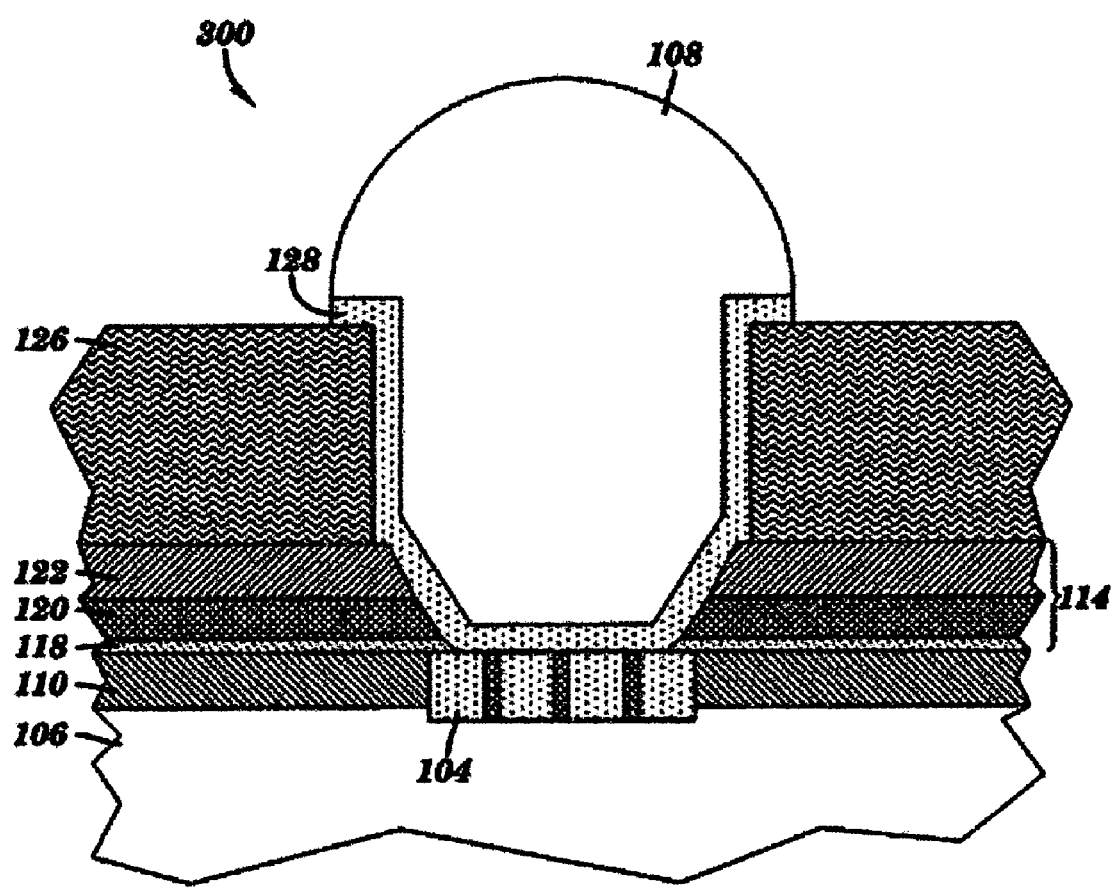

Following lithographic patterning of the TD via 116, a reactive ion etch (RIE), for example using $CF_4$, oxygen, argon or some combination thereof, is used to open each of the layers in the stack (i.e., nitride layer 122, oxide layer 120 and SiC(N, H) layer 118 to expose the copper layer 104, as shown in FIG. 2(b). Then, in FIG. 2(c), the conventional TD aluminum process is implemented, including deposition of a thin liner stack 124 (comprised of one or more of the following materials: Ti, TiN, Ta, TaN, each layer being about 200 to about 800 Å in thickness) to serve as a diffusion barrier between TD aluminum and the copper layer 104, followed by the TD aluminum deposition (e.g., 1.2 microns of Al—Cu alloy, with a Cu concentration of about 0.5%). FIG. 2(*c*) illustrates the TD aluminum pad 102 following deposition, lithography and etching.

Next, a final passivating polyimide layer, such as a photosensitive polyimide (PSPI) layer 126, is formed over the topmost pad nitride layer 122, as shown in FIG. 2(*d*). The polyimide layer 126 is patterned to define the opening in which the solder ball limiting metallurgy (BLM) is then deposited and patterned, as shown in FIG. 2(*e*). As is known in the art, the BLM includes a stack 128 comprised of, for example, one or more of the following materials: TiW, CrCu and Cu). Finally, after resist formation, lithography and etching of the BLM stack 128, the C4 plating of the solder material (e.g., 97% Pb/3% Sn) is then deposited to result in the structure shown in FIG. 1.

As indicated previously, an ability to eliminate the TD aluminum pad would be advantageous by reducing the costs of the FBEOL structure, as well as by increasing the yield associated with the above described manufacturing steps. However, a simple elimination of the TD aluminum structure itself from the process of record results in a Cu-polyamic acid or Cu-polyimide interaction. Unfortunately, such interactions can have adverse consequences on electrical performance and reliability.

Accordingly, FIGS. 3(*a*) through 3(*e*) illustrate a method and structure for eliminating aluminum terminal material at the FBEOL of semiconductor structures, in accordance with an embodiment of the invention. In particular, FIG. 3(*a*) illustrates a point of FBEOL processing at which the pattern of the terminal via 116 is etched through the silicon nitride layer 122 and oxide layer 120, but the SiC-based layer doped with nitrogen (or nitride material) layer 118 is left in place, thus protecting the copper pad 104. Then, with the SiC(N, H) layer 118 still in place, the organic polyimide passivation layer 126 (e.g., PSPI) is deposited, patterned and cured, as shown in FIG. 3(*b*). At this point, the structure will be ready for deposition of the BLM, once the SiC(N, H) layer 118 is removed, as shown in FIG. 3(*c*).

In one embodiment, the SiC(N, H) layer 118 may be removed (preferably immediately after polyimide curing) by an etchant chemistry that does not aggressively attack copper. As the wafer is transported to another chamber or another location for the BLM process, small levels of copper oxidation may be cleaned by BLM back sputter etching prior to BLM deposition. Alternatively, the SiC(N, H) layer 118 may remain in place following the polyimide curing until placement in the BLM deposition chamber. Then, the SiC(N, H) layer 118 itself may be removed by physical back sputter etching within the BLM chamber prior to BLM deposition.

Another alternative for protecting the copper pad 104 may be to coat the pad with an organic solderability preservative (OSP) layer, such as BTA (benzotriazole), which is effective in preventing surface corrosion. It can be applied by immersing in a 0.2% aqueous solution at 60° C. for 2 minutes, for example. This layer may be readily removed during sputter etching, just prior to BLM deposition. Additional steps, such as an elevated temperature bake-out in an $N_2$ or forming gas environment may also be implemented if needed. Still another alternative for protecting the copper pad 104 may be to coat the wafer with a thin layer of TaN or other conductive oxidation barrier, following the terminal via patterning. This would then be followed by a planarization step such that the TaN material is left only in the terminal via "well" and not the top surfaces.

In any case, once the SIC(N, H) layer 118 is removed, the BLM stack 128 is formed over the passivation layer 126 and directly upon the copper pad 104, as shown in FIG. 3(*d*). Finally, in FIG. 3(*e*), the solder ball connection 108 is formed on the patterned BLM stack 128, thus resulting in structure 300 that is free of TD aluminum. Moreover, the structure 300 exhibits favorable strength pull test results with respect to the conventional devices in which the BLM is formed over a TD aluminum pad.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for far back end of line (FBEOL) semiconductor device formation, the method comprising:

forming a terminal copper pad in an upper level of a semiconductor wafer;

forming an insulating stack over said terminal copper pad;

patterning and opening a terminal via within a portion of said insulating stack so as to leave a bottom cap layer of said insulating stack protecting said terminal copper pad;

forming and patterning an organic passivation layer over the top of said insulating stack while said bottom cap layer remains protecting said terminal copper pad;

removing said bottom cap layer over said terminal copper pad once said forming and patterning said organic passivation layer is completed;

depositing a ball limiting metallurgy (BLM) stack over said organic passivation layer and said terminal copper pad; and forming a solder ball connection on a patterned portion of said BLM stack.

2. The method of claim 1, wherein said bottom cap layer comprises a nitrogen doped hydrogenated silicon carbide cap layer.

3. The method of claim 2, wherein said nitrogen doped hydrogenated silicon carbide cap layer is removed by chemical etch following curing of said organic passivation layer.

4. The method of claim 2, wherein said nitrogen doped hydrogenated silicon carbide cap is removed by back sputter etching prior to said depositing said BLM stack.

5. The method of claim 2, further comprising coating said terminal copper layer with an organic solderability preservative (OSP) layer and removing said OSP layer by back sputter etching prior to said depositing said BLM stack.

6. The method of claim 2, further comprising coating said organic passivation layer and said terminal copper layer with a conductive oxidation prevention barrier layer following said terminal via patterning and thereafter removing portions of said barrier layer from said organic passivation layer.

7. The method of claim 1, wherein said organic passivation layer further comprises a polyimide layer.

8. The method of claim 1, wherein said insulating stack further comprises a nitrogen doped hydrogenated silicon carbide cap layer, a silicon oxide layer deposited on said nitrogen doped hydrogenated silicon carbide cap layer, and a silicon nitride layer deposited on said silicon oxide layer.

* * * * *